United States Patent [19]
Tseng

[11] Patent Number: 6,072,330
[45] Date of Patent: Jun. 6, 2000

[54] RING EFFECT IMPROVEMENT FOR HIGH SPEED TRANSMISSION OF DIGITAL DATA

[75] Inventor: Chiung Jui Tseng, Taipei, Taiwan

[73] Assignee: VIA Technologies, Inc., Taipei, Taiwan

[21] Appl. No.: 09/022,498

[22] Filed: Feb. 12, 1998

[51] Int. Cl.$^7$ .................................................. H03K 17/16
[52] U.S. Cl. ................................ 326/29; 326/93; 326/26; 327/379
[58] Field of Search .................................. 326/21, 26, 29, 326/93, 104; 327/24, 199, 225, 374, 379

[56] References Cited

U.S. PATENT DOCUMENTS 5,461,649 10/1995 Bailey et al. .............................. 327/28
5,537,062 7/1996 Mote, Jr. ...................................... 326/93

*Primary Examiner*—Michael Tokar
*Assistant Examiner*—Anh Tran
*Attorney, Agent, or Firm*—Bacon & Thomas

[57] ABSTRACT

The present invention comprises positive/negative masking signals which are added to an electronic circuit where ring phenomena may happen during high speed transmission of digital data, so as to eliminate the ring effect, and data can be transferred smoothly. Since the present invention uses only digital electronic circuit to solve the ring effect of related signals, no matter how long the cable between different subsystems is, the ring effect can be masked automatically. The problem of impedance matching is not necessarily considered, so the present invention is very valuable.

3 Claims, 3 Drawing Sheets

RING EFFECT IMPROVEMENT FOR HIGH SPEED TRANSMISSION OF DIGITAL DATA

FIELD OF THE INVENTION

The present invention relates to an improvement that eliminates the ring effect during high speed transmission of digital data, and more particularly to an improvement which uses a digital circuit instead of an analog circuit to eliminate the ring effect that occurs during high speed transmission of digital data.

BACKGROUND OF THE INVENTION

As people need electronic products with higher speed and higher accuracy, the cycle time of the strobe/trigger signal of related digital electronic circuits is as a low as nanosecond, which causes many new problems in signal processing.

One of the problems relates to a cable connected between different subsystems. Since the lengths of the cable between different subsystems are different, the impedance between different subsystems cannot be matched with one another. The related digital electronic circuits cannot be designed to adapt to different situations, so ring phenomena will happen at falling/rising edges of the strobe/trigger signals.

As shown in FIG. 1, showing a strobe signal as an example, DATA 4 is generally transferred at the falling edge 2 of STROBE 1. The falling edge 2 will trigger related digital electronic gates for data transmission, and the rising edge 3 of STROBE 1 can also be used to trigger the next data transmission or to end up with the previous data transmission.

If ring phenomena happen at falling/rising edges 2, 3 of STROBE 1, as shown in FIG. 2, the oscillation of STROBE 1 will cause the related electronic gates to open/close rapidly, and result in many errors and confusions of the data transmission.

The prior art solution to the ring effect of electronic circuits usually uses analog devices, including elements such as resistors and capacitors, for impedance matching, but such analog method can not be employed in high speed digital electronic circuits, due to the fact that the lengths between different subsystems are different.

OBJECT OF THE INVENTION

It is therefore an object of the present invention to provide a positive/negative masking signal the point at where ring phenonmenon to occur in a digital electronic circuit to thereby eliminate the ring effect and result in a smooth data transmission.

BRIEF DESCRIPTION OF THE DRAWINGS

The present invention can be better understood by detailed descriptions of the following drawings, in which.

DETAILED DESCRIPTION OF THE INVENTION

Figure 1:
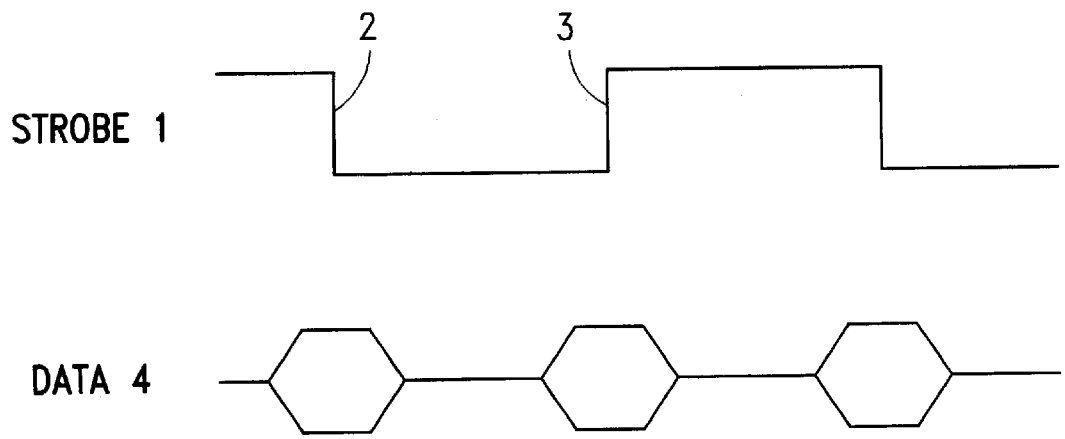
FIG. 1 is a schematic diagram showing the data transmission triggered by a strobe signal in a digital electronic circuit.
Figure 2:
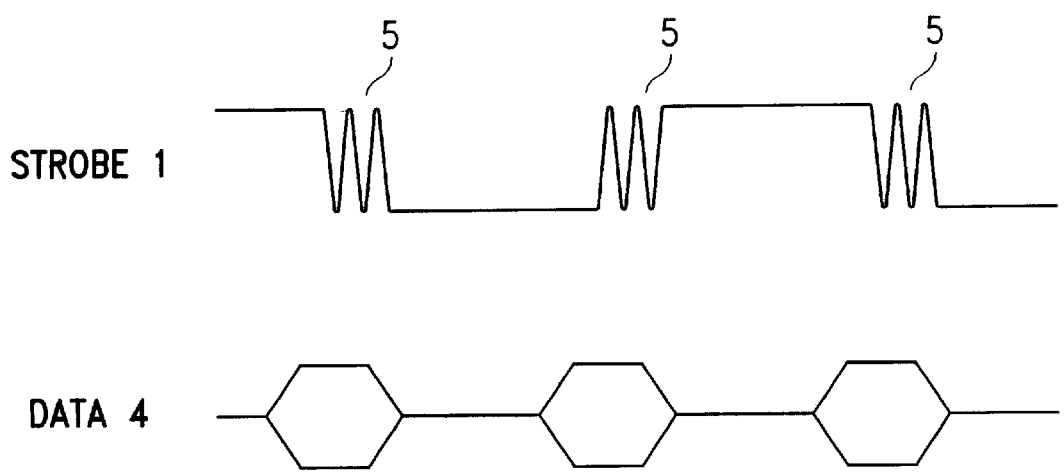
FIG. 2 is a schematic diagram showing that ring effects happen in a strobe signal of the digital electronic circuit.
Figure 3:
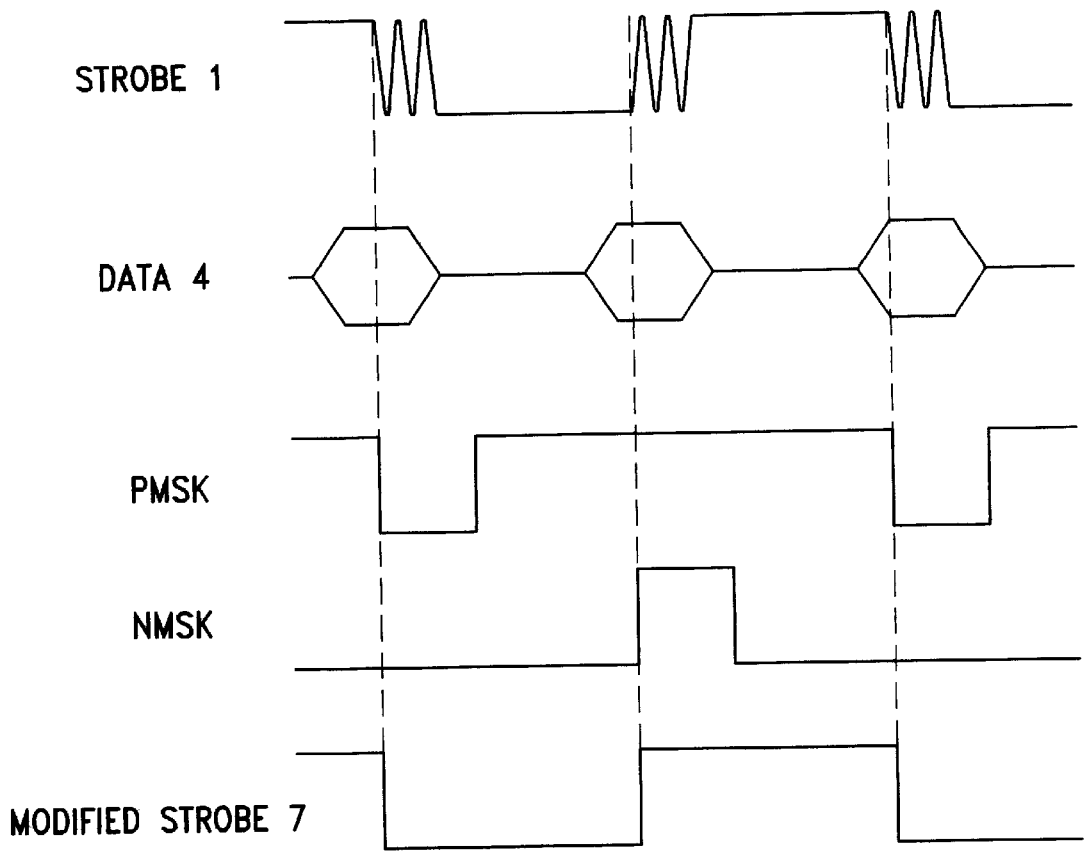
FIG. 3 is a schematic diagram showing that positive/negative masking signals of the present invention are used to eliminate ring effects.
Figure 3:
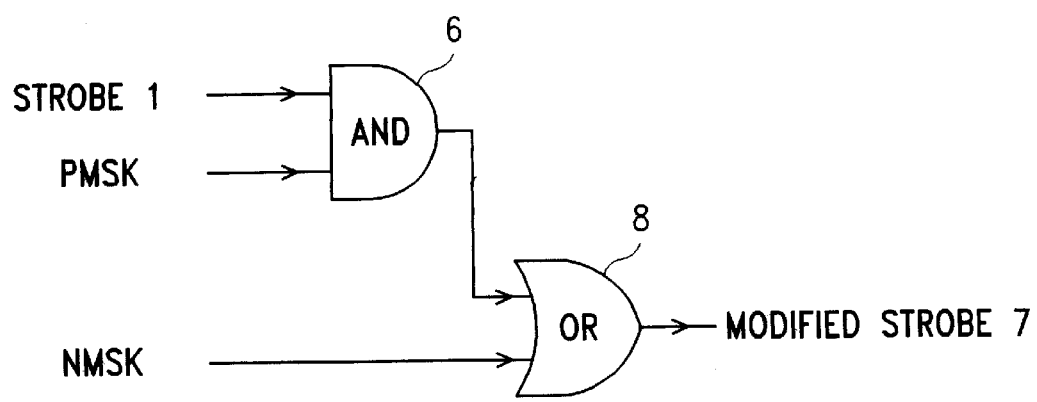

Please refer to FIG. 3, which is a schematic diagram showing the manner in which positive/negative masking signals of the present invention are used to eliminate ring effect, a strobe signal being used as an example by way of explanation. As shown in the figure, a positive masking signal PMSK appears just at the falling edge 2 of STROBE 1, and is inputted into an AND gate 6 with STROBE 1; while a negative masking signal NMSK appears just at the rising edge 3 of STROBE 1, and is inputted into an OR gate 8 with the output of AND gate 6. Therefore, a MODIFIED STROBE 7 is generated at the output of OR gate 8 for triggering data transmission in a practical manner.

Figure 4:
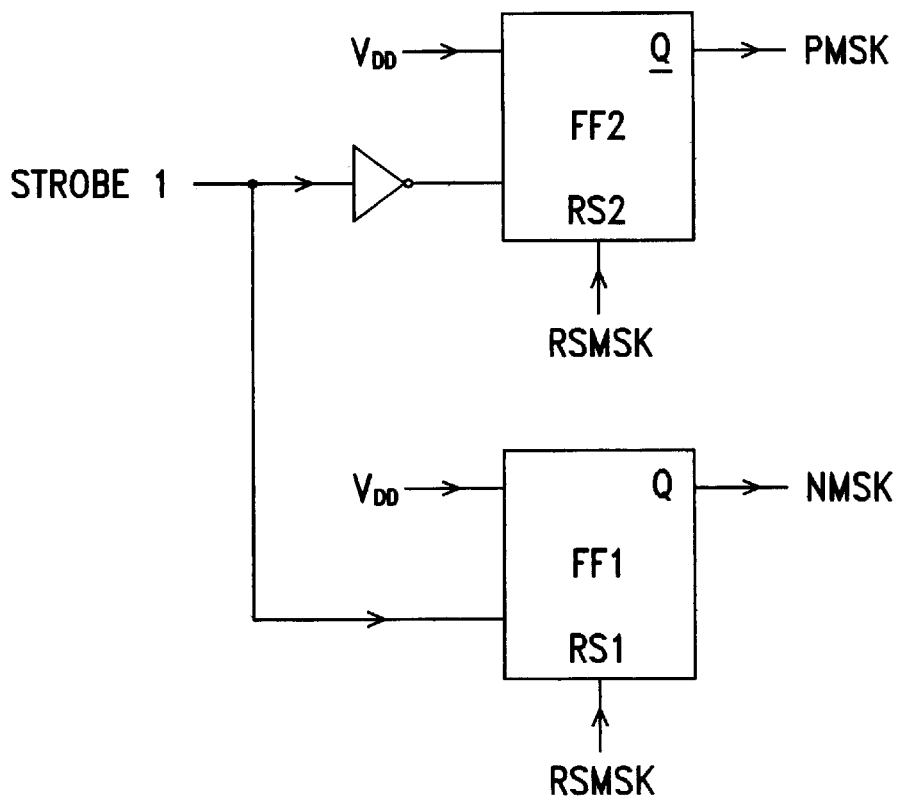
FIG. 4 is a circuit diagram of the present invention for generating positive/negative masking signals.

Please refer to FIG. 4, which is a circuit diagram of the present invention for generating positive/negative masking signals. As shown in the figure, STROBE 1 and its inverted signal are inputted into D type flip flops FF1 and FF2 respectively, and system power source $V_{DD}$ is inputted into the other inputs of FF1 and FF2. At the time of the falling/rising edge 2, 3 of STROBE 1, PMSK and NMSK are generated at Q/Q of FF2/FF1 respectively. As shown in FIG. 3, PMSK and NMSK are then inputted into AND gate 6 and OR gate 8 respectively to generate MODIFIED STROBE 7 for triggering data transmission.

Figure 5:
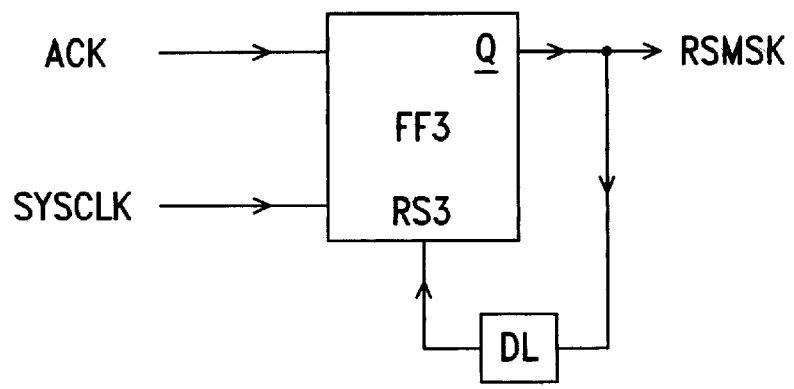
FIG. 5 is a circuit diagram of the present invention for resetting positive/negative masking signals.

After MODIFIED STROBE 7 triggers and finishes data transmission, a reset signal RSMSK should be generated to reset FF1/FF2 for the next data transmission. Please refer to FIG. 5, which is a circuit diagram of the present invention for resetting positive/negative masking signals. When the transmission of a set of data is accomplished, the digital electronic system will generally generate an acknowledge signal ACK(e.g. PUSH) to trigger the related electronic circuits for the next operation. Such acknowledge signal ACK is inputted into a D type flip flop FF3 with the system clock SYSCLK, Q terminal of FF3 then outputs a reset signal RSMSK to be delivered to the reset terminal RS1 and RS2 of FF1 and FF2 for resetting FF1 and FF2. As soon as FF1 and FF2 are reset, RSMSK will pass through a delay circuit DL to be fed back to the reset terminal RS3 of FF3 for resetting FF3 itself in order to accept the next acknowledge signal.

The system power source $V_{DD}$ in FIG. 4 represents the logic level of the system, which is +5V when positive logic is used, and is the logic ground potential (e.g. 0V) when negative logic is used.

The present invention uses only digital electronic circuitry to eliminate the ring effect between related signals so that no matter how long the cable between different subsystems is, the ring effect can be masked automatically. The problem of impedance matching is not required to be considered, so the present invention is very valuable.

The present invention is not only applicable to the strobe signal of a digital electronic circuit, but also applicable to other trigger signals, clock signals and so on. As long as the signals are subject to ring phenomena, the method and circuits of the present invention can be employed to solve problems. The present invention is particularly useful or related circuits that use a "single data rate" and a "double data rate" in a computer. Since the speed of such circuits is on the order of nanosecond, ring phenomena will definitely happen, and the present invention can be used to solve the related problems appropriately.

Undoubtedly after reading the above descriptions any skillful person in the art can create many different variations without departing the spirit and scope of the accompanying claims. Therefore, it is intended that the appended claims will cover all those variations.

I claim:

1. A circuit for eliminating a ring effect that occurs during high speed transmission of digital data, wherein a positive masking signal is generated at a falling edge of a strobe/trigger signal of a digital electronic circuit and is inputted into an AND logic gate together with the strobe/trigger signal to eliminate the ring effect at an output of the AND logic gate, the output being in the form of a positively masked modified strobe/trigger signal, wherein said strobe/trigger signal is also inverted and inputted into a D type flip flop together with a system logic level to generate said positive masking signal, and wherein a reset signal is used to change the state of said positive masking signal after a set of data is received correctly.

2. A circuit for eliminating a ring effect that occurs during high speed transmission of digital data, wherein a negative masking signal is generated at a rising edge of a strobe/trigger signal of a digital electronic circuit and is inputted into an OR logic gate together with the strobe/trigger signal to eliminate the ring effect at the output of the OR logic gate, the output being in the form of a negatively masked modified strobe/trigger signal, wherein said strobe/trigger signal and a system logic level are inputted into a D type flip flop to generate said negative masking signal, and wherein a reset signal is used to change the state of said negative masking signal after a set of data is received correctly.

3. The circuit according to claims 1 or 2, wherein said reset signal is generated by a system clock and an acknowledge signal, said acknowledge signal representing that data is received correctly, and said system clock and said acknowledge signal are inputted into another D type flip flop to generate said reset signal, said reset signal passing through a delay circuit to be fed back to a reset terminal of said D type flip flop and thereby cause said reset signal to itself be reset after a predetermined time period.

* * * * *